United States Patent
Pitner et al.

(10) Patent No.: US 12,027,218 B2
(45) Date of Patent: Jul. 2, 2024

(54) LOCATION DEPENDENT SENSE TIME OFFSET PARAMETER FOR IMPROVEMENT TO THE THRESHOLD VOLTAGE DISTRIBUTION MARGIN IN NON-VOLATILE MEMORY STRUCTURES

(71) Applicant: SanDisk Technologies LLC, Addison, TX (US)

(72) Inventors: Xue Bai Pitner, Sunnyvale, CA (US); Prafful Golani, Minneapolis, MN (US); Ravi Kumar, Redwood City, CA (US)

(73) Assignee: SanDisk Technologies LLC

( * ) Notice: Subject to any disclaimer, the term of this patent is extended or adjusted under 35 U.S.C. 154(b) by 163 days.

(21) Appl. No.: 17/554,321

(22) Filed: Dec. 17, 2021

(65) Prior Publication Data
US 2023/0197173 A1    Jun. 22, 2023

(51) Int. Cl.
| | |
|---|---|
| G11C 16/04 | (2006.01) |
| G11C 16/34 | (2006.01) |
| G11C 16/26 | (2006.01) |
| H10B 41/27 | (2023.01) |
| H10B 43/27 | (2023.01) |

(52) U.S. Cl.
CPC ...... *G11C 16/3459* (2013.01); *G11C 16/0483* (2013.01); *G11C 16/26* (2013.01); *H10B 41/27* (2023.02); *H10B 43/27* (2023.02)

(58) Field of Classification Search
CPC . G11C 16/3459; G11C 16/0483; G11C 16/26; G11C 16/32; G11C 11/5628; G11C 2211/5621; G11C 16/10; H10B 41/27; H10B 43/27
USPC ...................................... 365/185.17
See application file for complete search history.

(56) References Cited

U.S. PATENT DOCUMENTS

| | | | | |
|---|---|---|---|---|
| 7,489,553 | B2* | 2/2009 | Mokhlesi | G11C 16/26 365/185.21 |
| 9,449,700 | B2* | 9/2016 | Shah | G11C 16/34 |
| 9,698,676 | B1* | 7/2017 | Huynh | H02M 3/07 |
| 9,934,872 | B2* | 4/2018 | Magia | G11C 16/349 |
| 9,959,067 | B2* | 5/2018 | Yang | G06F 3/064 |
| 9,978,456 | B2* | 5/2018 | Khandelwal | G11C 16/26 |

* cited by examiner

*Primary Examiner* — Tha-O H Bui
(74) *Attorney, Agent, or Firm* — Dickinson Wright PLLC; Steven C. Hurles

(57) ABSTRACT

A method for performing a program verify operation with respect to a target memory cell in a memory structure of a non-volatile memory system is provided. The method may include the step of determining a location of the target memory cell within the structure and, based upon the determined location of the target cell and with respect to each programmable memory state: (1) applying a first sense signal at a first point in time, and (2) applying a second sense signal at a second point in time. A time interval between the first and the second points in time is equal to a predetermined optimal time period plus or minus an offset parameter time value.

12 Claims, 15 Drawing Sheets

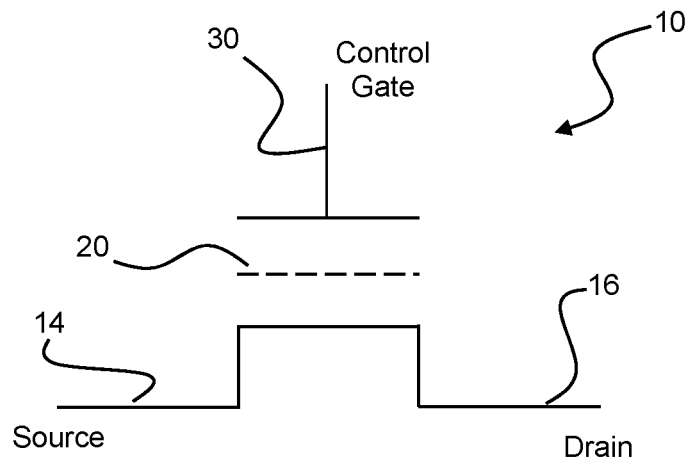
*FIG. 2 – Prior Art*
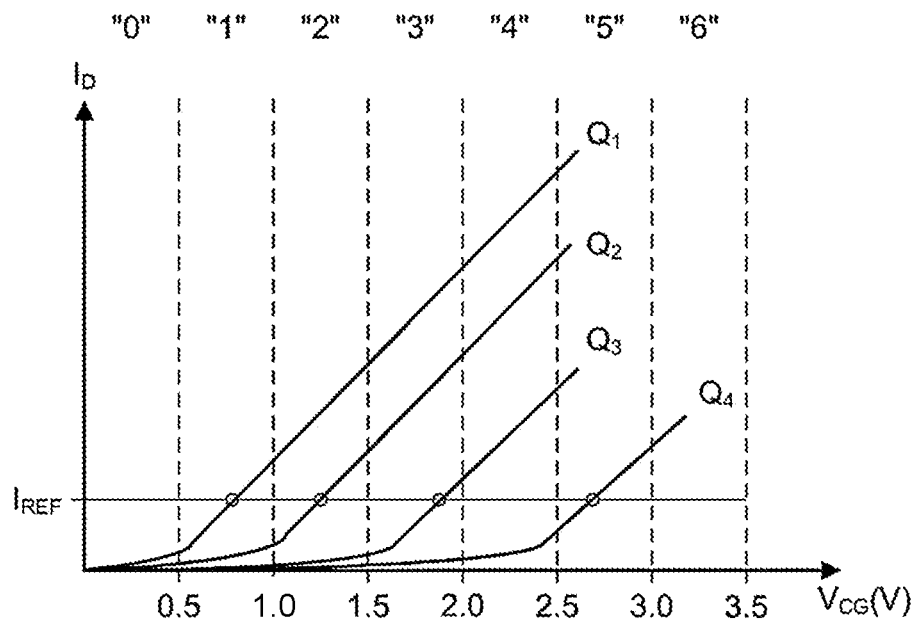
*FIG. 3 – Prior Art*

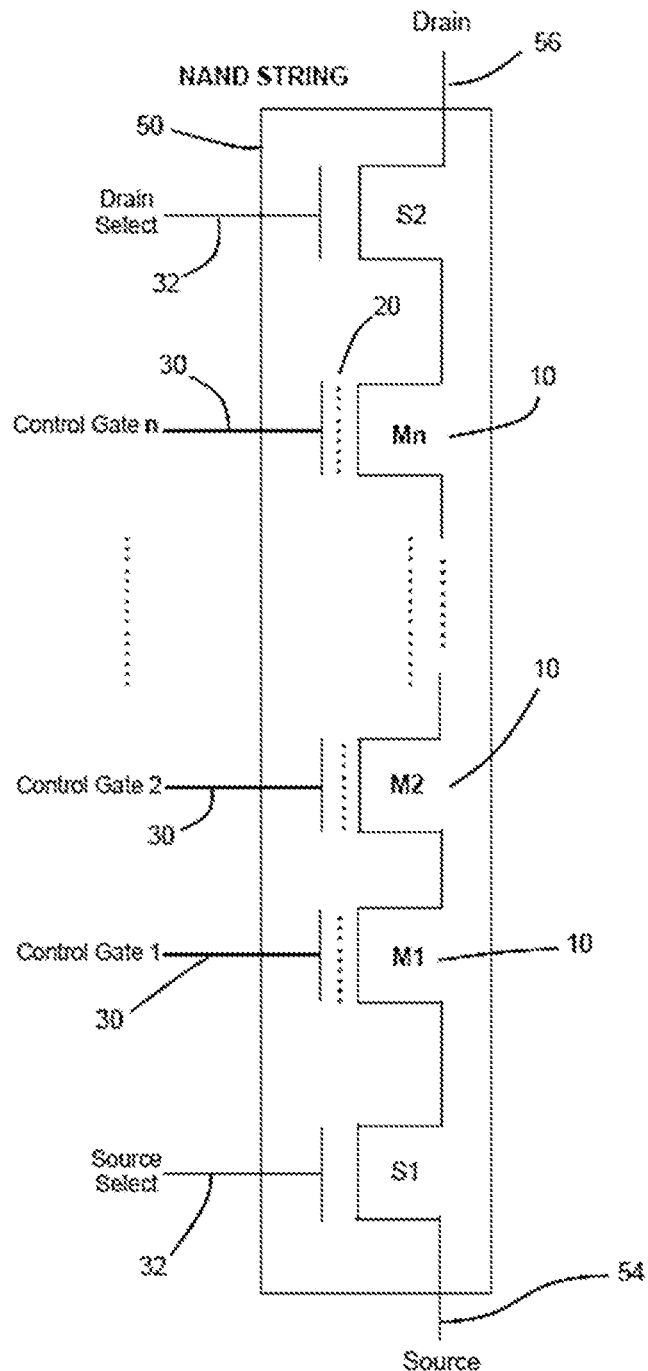
*FIG. 4A – Prior Art*

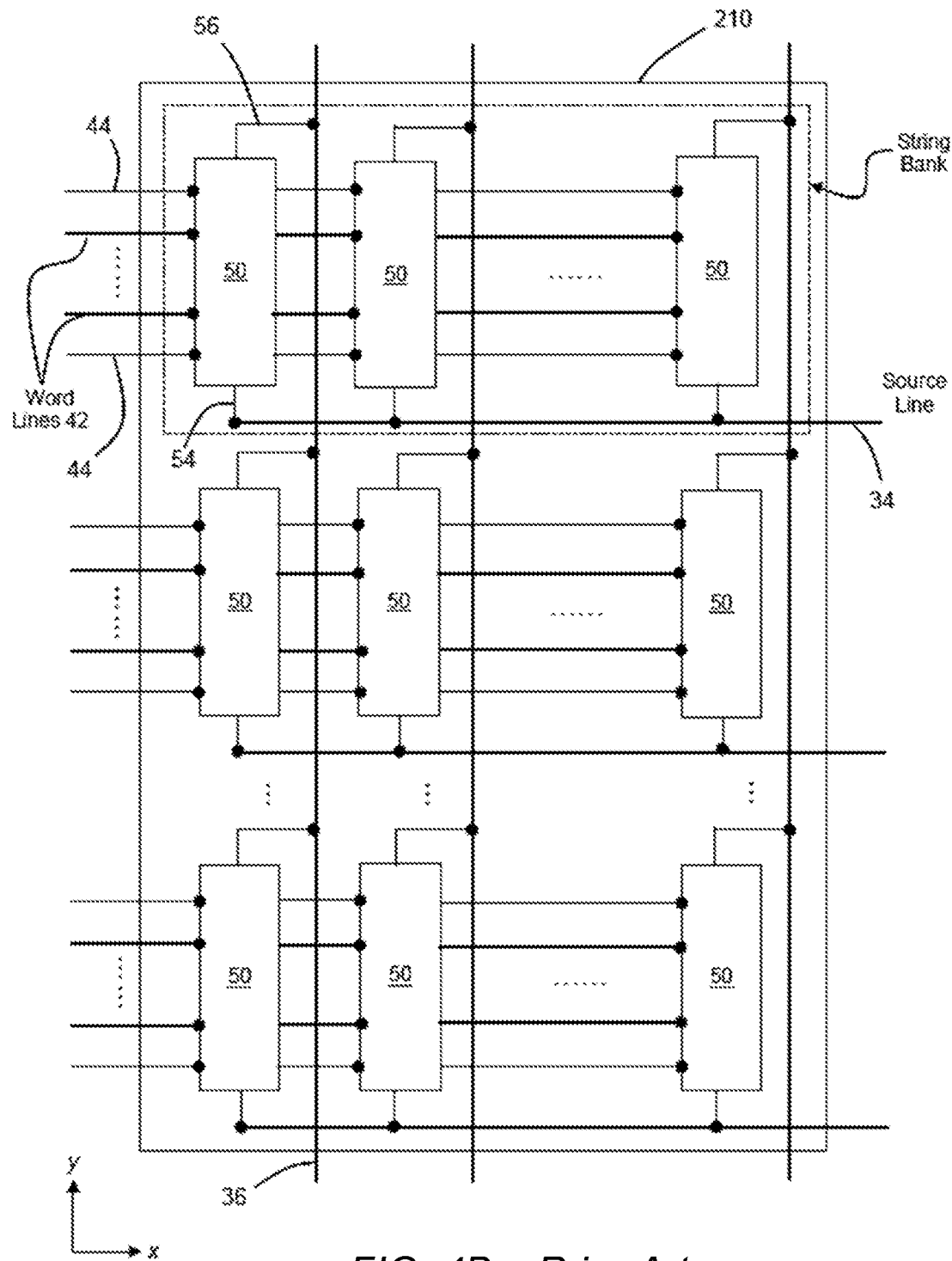
FIG. 4B – Prior Art

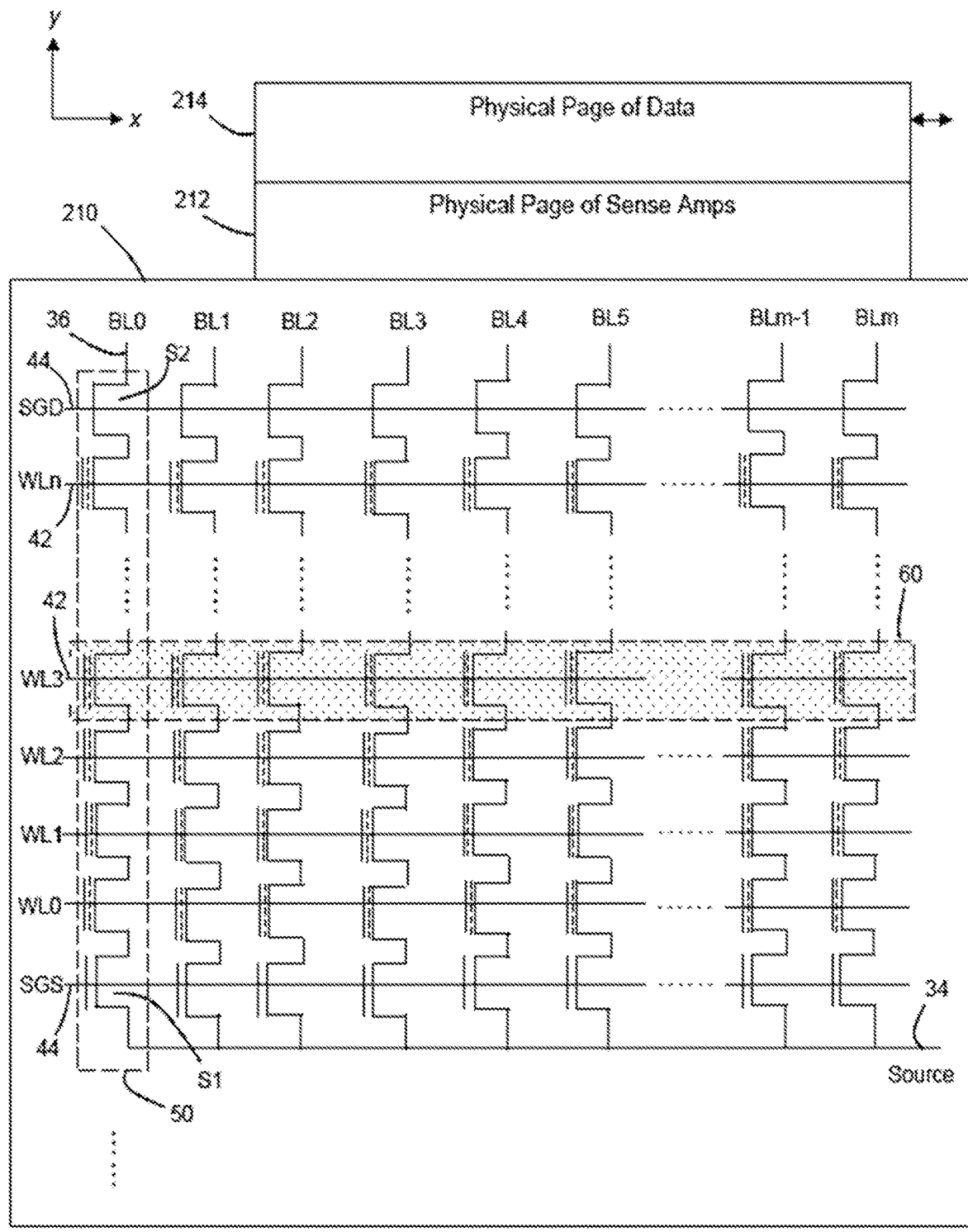
FIG. 5 – Prior Art

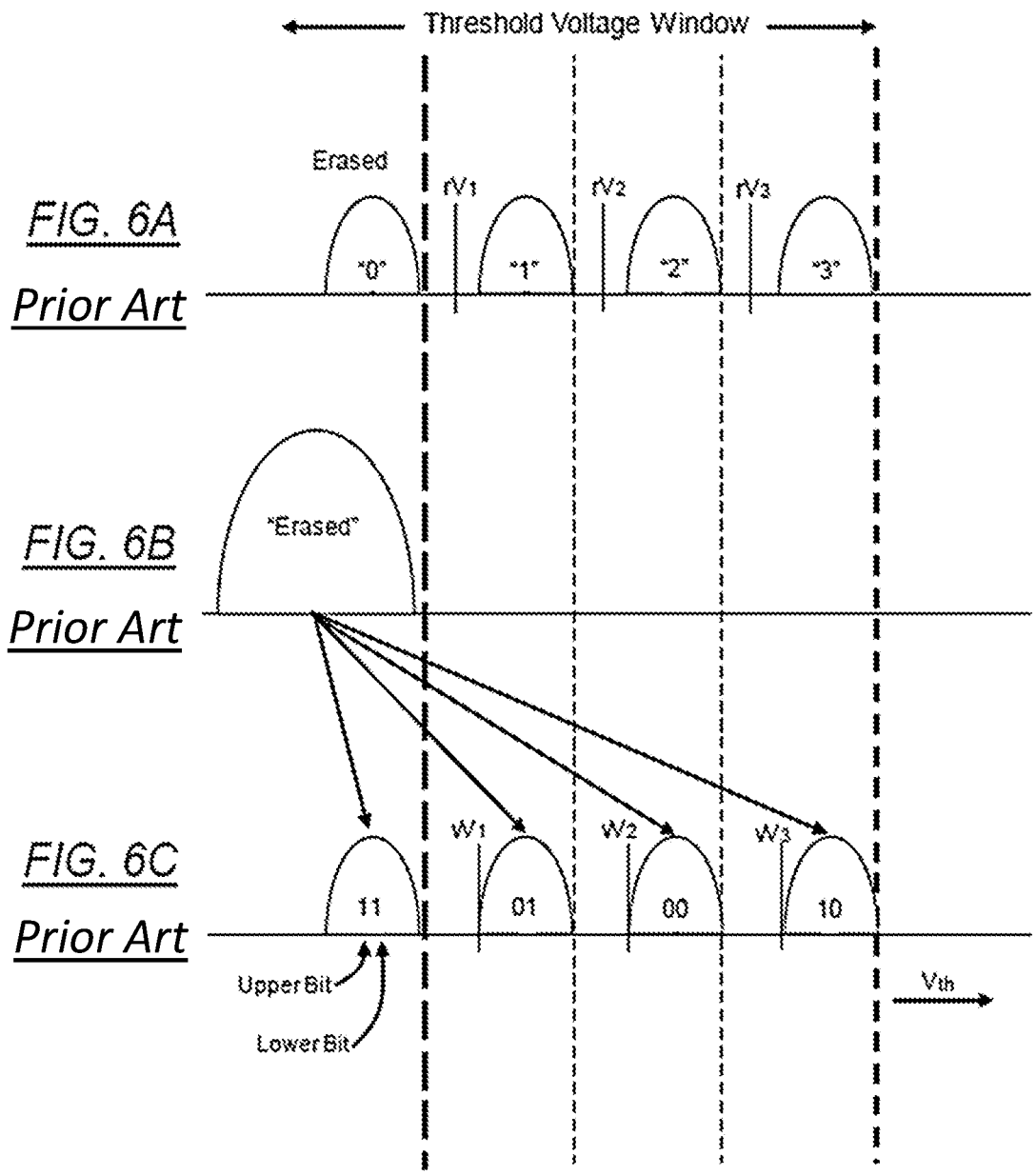

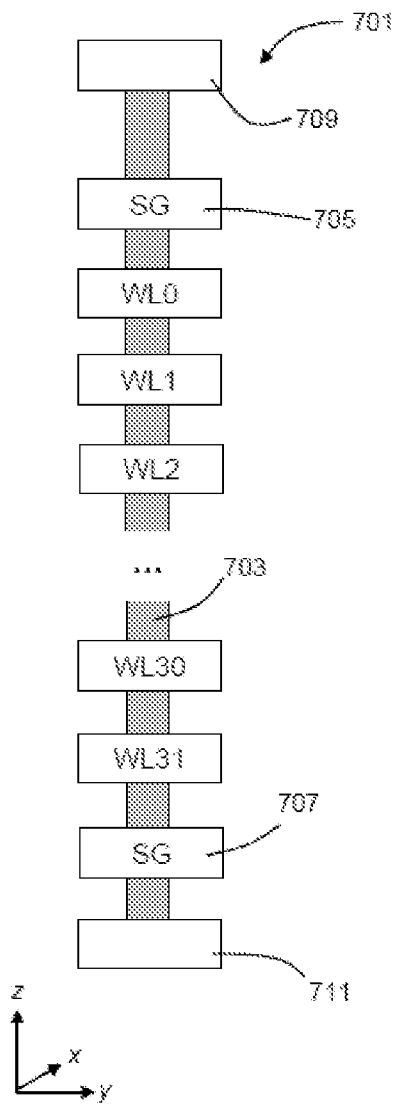
FIG. 7 – Prior Art

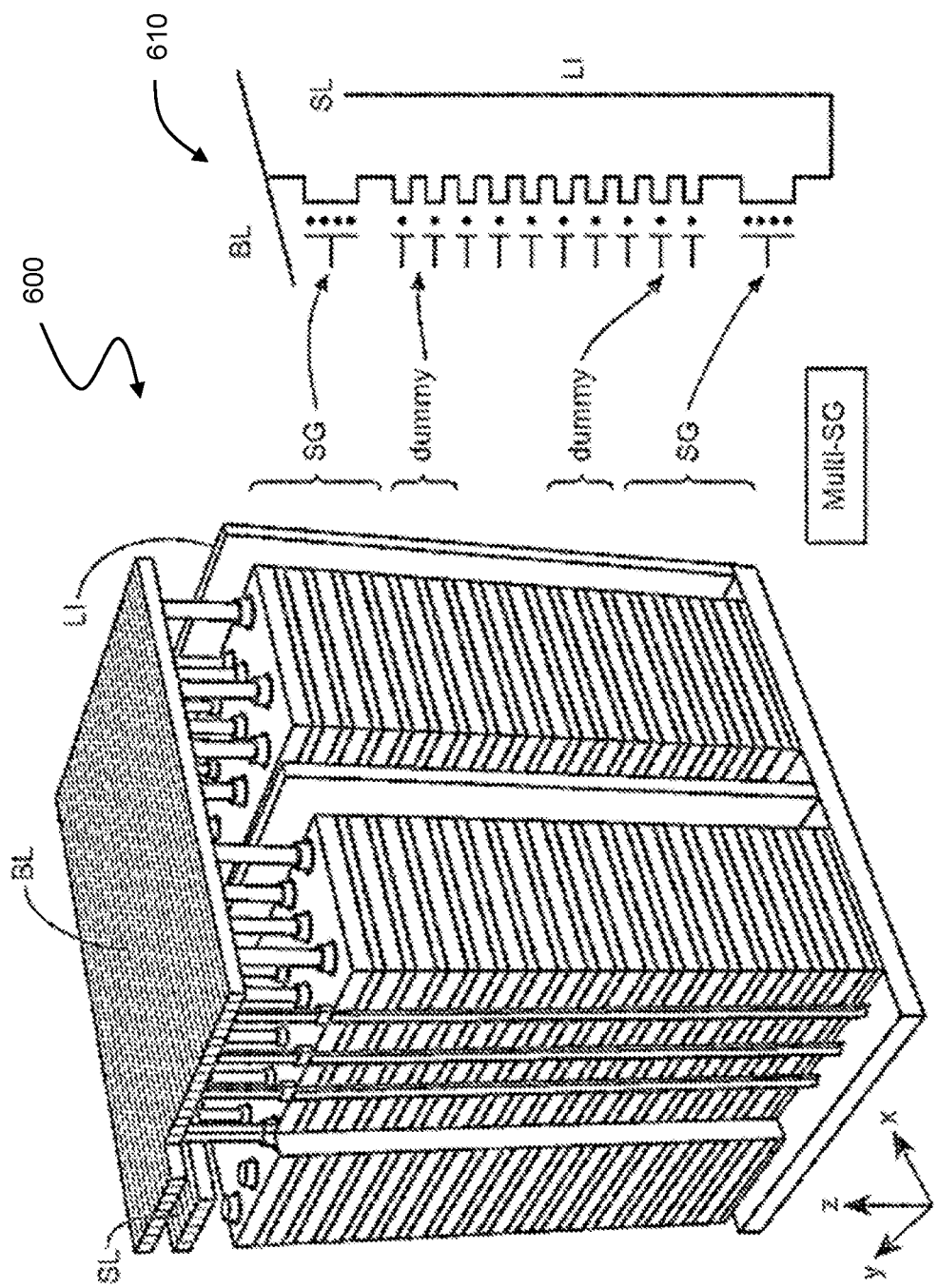
*FIG. 8 – Prior Art*

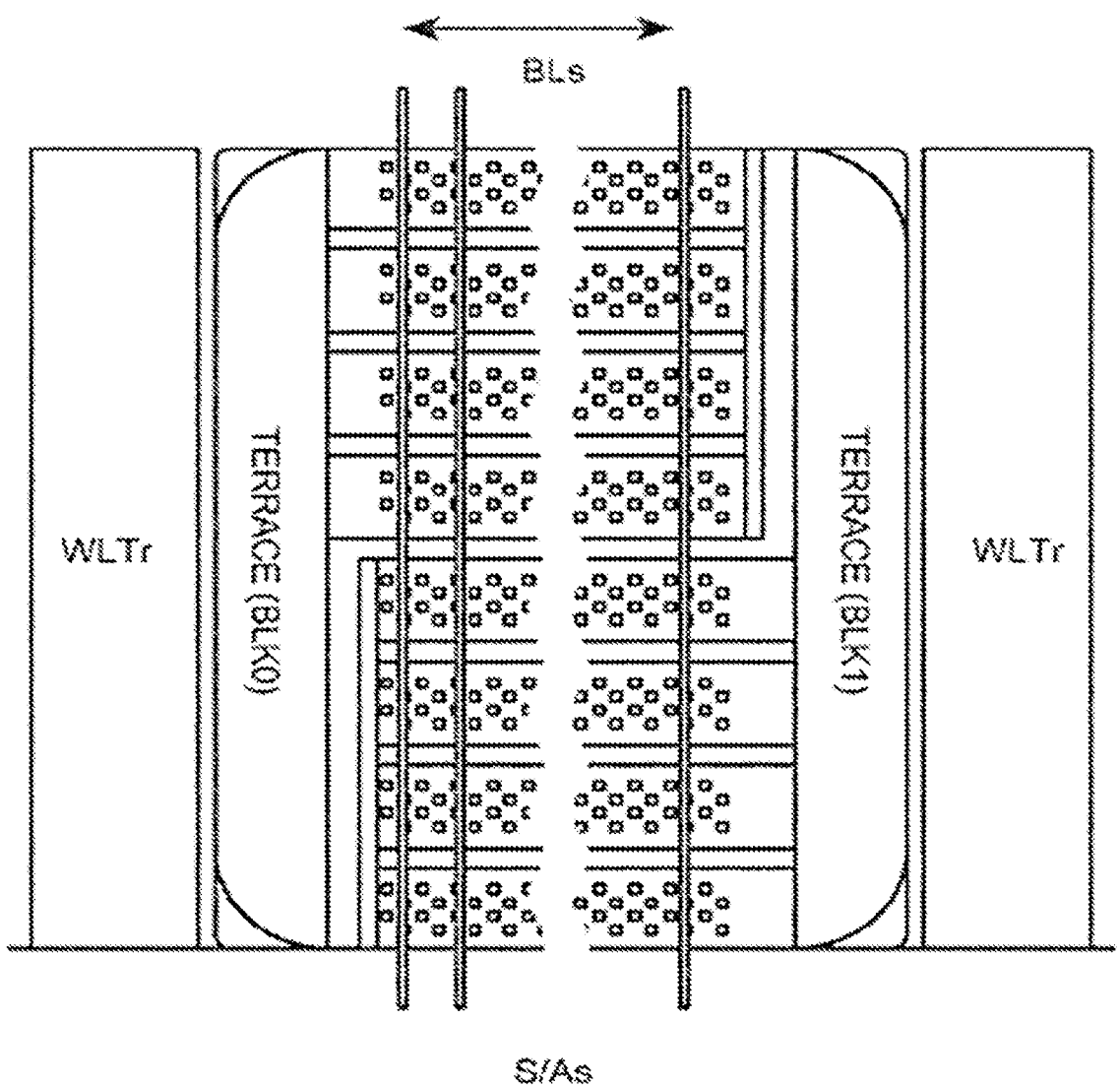
FIG. 9 – Prior Art

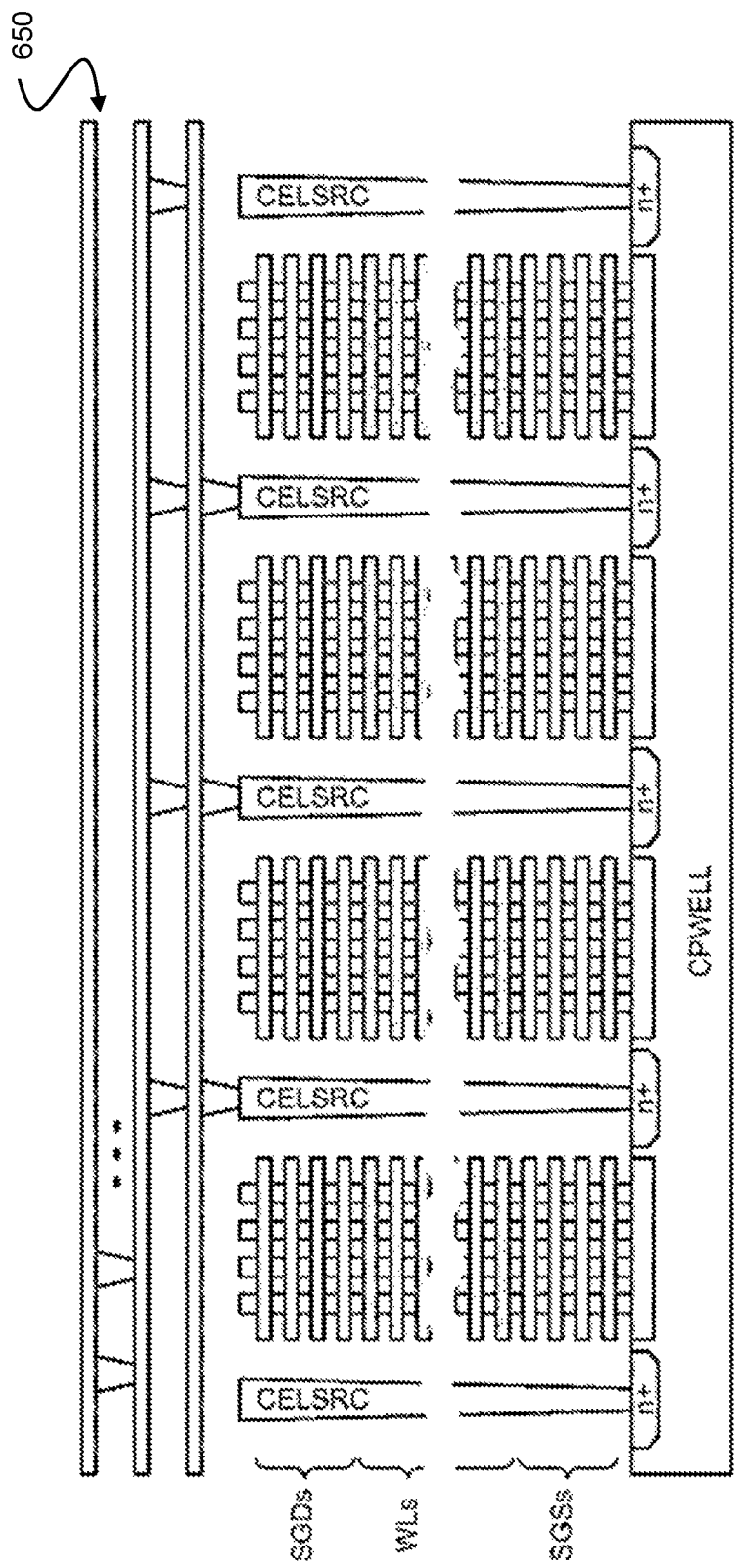
FIG. 10 – Prior Art

LOCATION DEPENDENT SENSE TIME OFFSET PARAMETER FOR IMPROVEMENT TO THE THRESHOLD VOLTAGE DISTRIBUTION MARGIN IN NON-VOLATILE MEMORY STRUCTURES

TECHNICAL FIELD

This disclosure relates to non-volatile memory storage systems in solid-state drives or other devices, including but not limited to flash drives or embedded/removable flash packages. More specifically, this disclosure relates to systems and methods for, during program verify operations, predictively applying one or more parameter offsets to address the effects of fluctuations in the electrical characteristics due to variations in the oxide material thicknesses between individual storage elements of the memory.

BACKGROUND

Due to emerging technology and market forces, solid-state drives (SSDs) are steadily replacing previously conventional data storage systems that rely on the rotation of magnetic mediums for reading and writing data (e.g., hard disk drives). Rather than comprising any mechanical or moving parts, solid-state memory comprises integrated circuit assemblies or interconnected flash components to provide non-volatile storage in which stored data can be persistently retained even during a planned or unplanned interruption of power. As a result, a solid-state drive is inherently faster and more robust (i.e., less susceptible to data loss and corruption), as well as consumes less power and is more compact in comparison to disk-based storage. Accordingly, non-volatile memory is a powerful storage solution with respect to many types of computing, consumer electronic, and stand-alone external storage (e.g., USB drives) devices. Advances in non-volatile memory structures have led to significant increases in their storage density capability and a reduction in their power consumption, thereby lowering the per-bit and bit-per-chip cost.

Generally, a non-volatile memory device may be comprised of one or more arrays of individual memory cells. With respect to some flash memory types, each memory cell is comprised of a floating gate that is positioned above and isolated from a channel region of a semiconductor substrate, wherein the floating gate is positioned between the source and drain regions. Also, a control gate is provided over and isolated from the floating gate, wherein a threshold voltage ($V_{th}$) of the memory cell transistor is controlled by and dependent upon the amount of charge that is retained on the transistor's floating gate. Specifically, in a switch-like manner, a minimum amount of voltage that must be applied to the control gate of the transistor before the transistor is activated to permit conduction between its source and drain regions is, therefore, determined by the level of charge being retained on the floating gate. As a result, bit-value data can be programmed onto and erased from the cell by precisely changing the level of charge on the floating gate in order to change the threshold voltage ($V_{th}$) characteristic of the transistor. In an array structure, the memory cells are addressable by word lines (rows) and bit lines (columns). One type of non-volatile memory storage defined by this general structure is referred to as NAND flash memory based upon its electrical characteristics, which resemble a NAND logic gate.

As explained in detail below, the number of bits that can be stored in an individual memory cell is dependent upon the number of distinct voltage ranges that may be partitioned within the threshold voltage ($V_{th}$) window of that memory cell. For example, to store one bit of data (referred to as a binary data), the possible threshold voltage ($V_{th}$) of a memory cell can be divided into two voltage ranges, wherein the ranges are assigned as logical data "1" and "0" respectively. Accordingly, a memory cell of this storage density order may be referred to as a "single-level cell" or SLC.

By further partitioning the threshold voltage ($V_{th}$) window of a memory cell into additional distinct voltage ranges, multiple levels of information may be stored. A memory cell of this storage density order may be referred to as a "multi-state cell" or MLC. For example, in order to store two bits of data, the threshold voltage ($V_{th}$) window of a cell can be further partitioned into four distinct voltage ranges, with each range assigned a bit value equal to, for example, "11," "10," "01," and "00." Accordingly, following an erase operation, the cell's threshold voltage ($V_{th}$) is negative, which could be defined as logic "11." As such, the positive threshold voltages ($V_{th}$) can be used for the programmed states of "10," "01," and "00." In a further example, to store three bits of data, the threshold voltage ($V_{th}$) window of a cell may be partitioned into eight distinct voltage ranges, with each range assigned a bit value equal to, for example, "111," "110," "100," "010," "011," "000," "001," and "101." A memory cell of this storage density order may be referred to as a "tri-level," "triple-level cell," or TLC. In a further example, to store four bits of data, the voltage threshold window of a memory cell may be partitioned into 16 distinct voltage ranges (or states), wherein each voltage range is assigned a certain bit value that is equal to, for example, "1111," "1110," "1100," "1000," "0111," "0011," "0001," "0000," "0001," "1001," "1101," "1011," "0110," "0100," "0101," and "1010." A memory cell of this type of storage density may be referred to, for example, as a "quad-level cell" (QLC).

The specific relationship between the data programmed into a memory cell and the threshold voltage ($V_{th}$) levels of the memory cell depends on the data encoding pattern or data scheme adopted for the memory cells.

In addition to the increasing storage densities with respect to a single memory cell, advances in non-volatile memory array structures have led to memory cells being stacked in a vertical direction with respect to the semiconductor substrate, thus creating a three-dimensional array structure as opposed to a planar two-dimensional array structure.

Accordingly, as the industry continues to achieve smaller sized memory devices with increased storage densities in order to store more data, this scaling of density entails certain performance and durability risks due to the architectural changes. In order to achieve the advantage of higher memory capacity for a fixed die size, the memory cells must be packed relatively closer together. Doing so, however, may result in an increased number of manufacturing, memory operation, and performance errors. For example, according to various observations, in a scalable memory structure, there are distinct challenges in maintaining the stability and uniformity across an entire memory structure with respect to the semiconductor materials used to fabricate certain memory storage elements of the scalable memory. Such nonuniformities can lead to performance limitations and inconsistencies in, for example, the programming operations of a memory structure, due to the variations in the electrical characteristics. For example, there appears to be a distinct correlation, or dependence, between variations existing amongst the relative thicknesses of the multiple oxide layers (e.g., AiO or SiO) comprising a substructure (e.g., in a memory cell, string, or block) of a scalable memory device (as a consequence of existing fabrication processes) and inconsistencies in, for example, the threshold voltage ($V_{th}$) distribution amongst the memory element(s) comprising the structure. Further, a given memory structure may exhibit string location-dependent inconsistencies with respect to the optimal time period occurring between sense signals that are applied during a program verify operation. Therefore, there is a particular need for a mitigation or correction mechanism that can operate during, for example, a program verify memory operation and in a predictive manner to adjust the optimal time period occurring between the applied sense signals based upon the observed inconsistencies in the optimal time period that are otherwise exhibited across the memory structure as a result of the possible inherent variations in the electrical characteristics across the memory structure.

SUMMARY

Various embodiments include a method for performing a program verify memory operation with respect to a target memory cell in a memory structure of a non-volatile memory system, the method comprising determining a location of the target memory cell within the memory structure and, based upon the determined location of the target memory cell and with respect to each programmable memory state: (1) applying a first sense signal at a first point in time, and (2) applying a second sense signal at a second point in time, wherein a time interval between the first and the second points in time is equal to a predetermined optimal time period plus or minus an offset parameter time value.

Other embodiments include a memory controller comprising a first port configured to couple to a non-volatile memory structure, wherein the memory structure comprises at least one vertical three-dimensional NAND-type memory array having a target memory cell, and wherein the memory controller is configured to: (1) initiate a program verify operation with respect to the target memory cell, (2) determine a location of the target memory cell within the memory array, and (3) based upon the determined location of the target memory cell and with respect to each programmable memory state: (a) apply a first sense signal at a first point in time, and (b) apply a second sense signal at a second point in time, wherein a time interval between the first and the second points in time is equal to a pre-determined optimal time period plus or minus an offset parameter time value.

Additional embodiments include a non-volatile memory system that is comprised of a memory structure comprised of: (1) at least one vertical three-dimensional NAND-type memory array having a target memory cell, and (2) a memory controller coupled to the memory structure and: (a) initiating a program verify operation with respect to the target memory cell, (b) determining a location of the target memory cell within the array, and (c) based upon the determined location of the target memory cell and with respect to each programmable memory state: (i) applying a first sense signal at a first point in time, and (ii) applying a second sense signal at a second point in time, wherein a time interval between the first and second points in time is equal to a pre-determined optimal time period plus or minus an offset parameter time value.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope, the disclosure is described and explained with added specificity and detail through the use of the accompanying drawings in which:

FIG. 2 schematically depicts a non-volatile memory cell, in accordance with exemplary embodiments;

FIG. 3 depicts the relationship between a source-drain current ID and a control gate voltage $V_{CG}$ for four different charges Q1-Q4 that a floating gate of a non-volatile memory cell may be selectively storing at any one time at a fixed drain voltage, in accordance with exemplary embodiments;

FIG. 4A schematically depicts a series of NAND-type memory cells organized into a string, in accordance with exemplary embodiments;

FIG. 4B schematically depicts a two-dimensional memory cell array, comprising a plurality of NAND-type strings, such as the type depicted in FIG. 4A, in accordance with exemplary embodiments;

FIG. 5 depicts a page of memory cells being sensed or programmed in parallel, and in relation to a memory array organized in a NAND-type configuration, in accordance with exemplary embodiments;

FIGS. 6A-C depict stages of programming four states of a population of MLC-type memory cells, in accordance with exemplary embodiments;

FIG. 7 depicts a vertical NAND-type string of a three-dimensional memory array, in accordance with exemplary embodiments;

FIG. 8 is a perspective view of a representative subsection of a monolithic three-dimensional NAND-type memory array, in accordance with exemplary embodiments;

FIG. 9 is a top view of two representative blocks of the memory array of FIG. 8, in accordance with exemplary embodiments;

FIG. 10 is a side view of a representative block of the memory array of FIG. 8, in accordance with exemplary embodiments;

DETAILED DESCRIPTION

Figure 1:
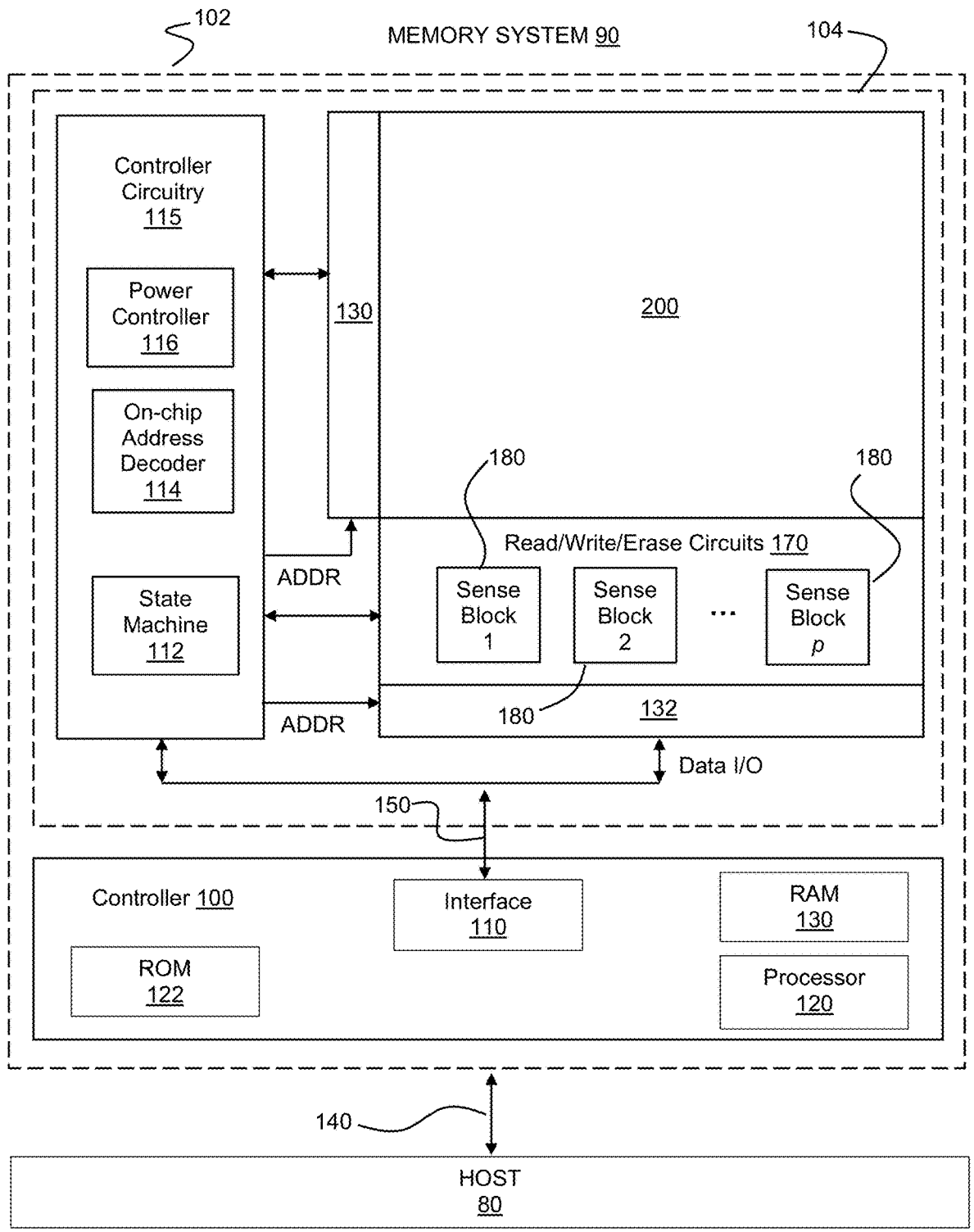
FIG. 1 is a block diagram of a memory system, in accordance with exemplary embodiments.

The following description is directed to various exemplary embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the detailed explanation of any specific embodiment is meant only to be exemplary of that embodiment and is not intended to suggest that the scope of the disclosure, including the claims, is limited to that particular embodiment.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that comprises customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it comprises one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as may be used herein, refer to a sequence of instructions that is designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions that is designed for execution on a computer system.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that comprises the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or mores," "ones or more," and/or "ones or mores" according to set theory, unless expressly specified otherwise.

In the detailed description that follows, reference is made to the appended drawings, which form a part thereof. It is recognized that the foregoing summary is illustrative only and is not intended to be limiting in any manner. In addition to the illustrative aspects, example embodiments, and features described above, additional aspects, exemplary embodiments, and features will become apparent by reference to the drawings and the detailed description below. The description of elements in each figure may refer to elements of proceeding figures. Like reference numerals may refer to like elements in the figures, including alternate exemplary embodiments of like elements.

Referring now to the drawings in detail and beginning with FIG. 1, there is depicted an exemplary embodiment of a memory system 90 and is an illustration of its main hardware components. In this particular embodiment, the memory system 90 operates and is in communication with a host device 80 through a host interface. Further, the memory system 90 comprises a memory device 102 whose operations are controlled by a controller 100. The host device 80 may comprise any device or system that utilizes the memory system 90 (e.g., a computing device). Accordingly, the memory system 90 may be in the form of a removable memory card or an embedded memory system. For example, the memory system 90 may be embedded in a solid-state drive that is installed in a laptop computer. In another example, the memory system 90 may be embedded within the host device 80 such that the host 80 and the memory system 90 (including controller 100) are formed on a single integrated circuit chip. In embodiments in which the memory system 90 is implemented within a memory card, the host device 80 may include a built-in receptacle for the one or more types of memory cards or flash drives (e.g., a universal serial bus (USB) port, or a memory card slot). Further, the host 80 may use adapters in which a memory card is plugged.

Still referring to FIG. 1, as described in detail below, the memory device 102 may comprise one or more memory arrays 200 of a plurality of non-volatile memory cells that are distributed over one or more integrated circuit chips. And, in accordance with this particular embodiment, the controller 100 may include several components that may include, but are not limited to, interface circuits 110, a processor 120, ROM (read-only memory) 122, RAM (random access memory) 130, and additional components. The controller 100 may, for example, be in the form of one or more application-specific integrated circuits (ASIC) in which the components included in such an ASIC depend on the particular application.

With respect to the memory array 200 itself, FIG. 2 is a schematic depiction of an individual non-volatile memory cell 10 in accordance with an exemplary embodiment. As is mentioned above, the memory cell 10 may be implemented by a field-effect transistor having a charge storage unit 20, such as a floating gate or a dielectric layer. In addition, the memory cell 10 comprises a source region 14 and a drain region 16. Further, a control gate 30 is positioned above the floating gate 20. Example types of non-volatile memory cells having this general structure include, but are not limited to, electrically erasable programmable read-only memory (EEPROM) and flash EEPROM, NAND (NOT-AND)-type cells, and memory devices utilizing dielectric storage elements (e.g., NROM™). In operation, the memory state of a cell (e.g., programmed or erased) may, in accordance with certain embodiments, be read by sensing the conduction current across the source and drain electrodes of the memory cell when a reference voltage is applied to the control gate 30. More specifically, for each given charge on the floating gate 20 of a memory cell, a corresponding conduction current with respect to a fixed reference control gate voltage may be detected. Accordingly, as is described above, the range of charges programmable onto the floating gate defines a corresponding threshold voltage window or a corresponding conduction current window of the memory cell 10. Alternatively, rather than detecting the conduction current among a partitioned current window, it is possible to set the threshold voltage for a given memory state under test at the control gate 30 and detect if the resulting conduction current is higher than or lower than a threshold current (i.e., a cell-read reference current). In one such exemplary implementation, detection of the conduction current relative to a threshold current is accomplished by examining a discharge rate of the conduction current through the capacitance of a respective bit line (BL).

FIG. 3 provides a graphical illustration of the correlation between the source-drain current ID and control gate voltage $V_{CG}$ for, for example, a non-volatile memory cell 10 having four different charge states Q1-Q4 that the floating gate may be selectively storing at any given time. As shown, with a fixed drain voltage bias, there exists four solid ID versus $V_{CG}$ curves representing four charge levels (or states) that can be programmed onto a floating gate of the memory cell, wherein the four charge levels respectively correspond to four of eight possible memory states. Therefore, as an example, the threshold voltage ($V_{th}$) window of a population of memory cells may range from 0.5 V to 3.5 V. In such an example, seven programmed memory states assigned as "0," "1," "2," "3," "4," "5," and "6," respectively, and one erased state (not shown in FIG. 3), may be demarcated by partitioning the threshold voltage ($V_{th}$) window into regions at intervals of 0.5 V each. Accordingly, if a reference current $I_{REF}$, of 2 µA is used as depicted, then a memory cell that is programmed with Q1 voltage may be considered to be in a memory state "1" as its curve intersects with $I_{REF}$ in the region of the threshold voltage ($V_{th}$) window that is demarcated by the voltage range VCG=0.5 V and 1.0 V. Similarly, Q4 is in a memory state "5."

Thus, as mentioned above, the more states that a memory cell 10 is made to store, the more finely divided is its threshold voltage ($V_{th}$) window. For example, in a memory cell 10 having a threshold voltage ($V_{th}$) window ranging from −1.5 V to 5 V, and thereby providing a possible maximum width (or distribution) of 6.5 V and storage across 16 memory states, each memory state may only occupy a voltage range of, for example, 200 mV to 300 mV. However, such a narrow voltage range will require higher precision in both the programming and read memory operations to achieve the required resolution.

According to certain exemplary embodiments, the individual memory cells 10 are organized into one or more strings, wherein each string is comprised of memory cells placed in series. For example, depicted in FIG. 4A is an exemplary embodiment of a string 50 that is comprised of NAND-type memory cells placed in a series configuration, wherein the transistor elements, i.e., $M_1$, $M_2$, ..., Mn (in which "n" may equal 4, 8, 16, or higher), are daisy-chained at their source and drain regions. Further, as discussed above with respect to FIG. 2, each of the memory transistors 10 in a string 50 has a charge storage element 20 (e.g., a floating gate) for storing a certain amount of charge therein so as to represent an intended memory state of that memory cell, wherein each memory transistor 10 comprises a control gate 30 that allows for control over the read and write memory operations. Present at the source terminal 54 and drain terminal 56 of the string 50 are select transistors S1, S2 that control the memory transistor's connection to the outlaying memory array. Specifically, when the source select transistor S1 is turned on, source terminal 54 of string 50 is coupled to a source line (SL). Likewise, when the drain select transistor S2 is turned on, the drain terminal 56 of string 50 is coupled to a bit line (BL) of the memory array.

Expanding outward a hierarchical level, FIG. 4B is a schematic diagram depicting an exemplary embodiment of a memory array 200 (such as memory array 210) comprised of a plurality of NAND strings 50 of the type illustrated in FIG. 4A. Along each column of NAND strings 50, a bit line (BL) 36 is coupled to the drain terminal 56 of each NAND string 50. In addition, along each bank of NAND strings 50, a source line (SL) 34 is coupled to the source terminals 54 of each NAND string 50. Further, the control gates 30 of the memory transistors 10 in a row of memory cells in the bank of NAND strings 50 are connected to the same word line (WL) 42. Therefore, when an addressed memory transistor 10 within a NAND string 50 is read or verified during a programming operation, an appropriate voltage is applied to its control gate 30. Concurrently, the remaining non-addressed memory transistors 10 within the NAND string 50 are fully turned on by applying a sufficient voltage to their respective control gates 30. As a result, an electrically conductive pathway is created from the source of the addressed memory transistor 10 to the source terminal 54 of NAND string 50, and from the drain of the addressed memory transistor 10 to the drain terminal 56 of the cell.

Further, the control gates 32 of the select transistors S1, S2 of each NAND string 50 in the memory array 210 provide control access to the NAND string at its source terminal 54 and drain terminal 56. The control gates 32 of the select transistors S1, S2 along a row in a bank of NAND strings 50 are connected to the same select line 44. Thus, an entire row of memory cells 10 in a bank of NAND strings 50 can be addressed by applying the appropriate voltages on the word lines (WL) 42 and select lines 44 of the bank of NAND strings 50.

Referring now to FIG. 5, depicted there is a detailed illustration of a bank of NAND strings 50 of a memory array 210 according to an exemplary embodiment thereof. This view is particularly useful in visualizing a row-by-row configuration of the memory array 210, wherein each row may be referred to as a physical "page." Accordingly, a physical page (e.g., page 60 denoted in FIG. 5) is a group of memory cells 10 that is enabled to be sensed or programmed in parallel. In such a configuration, a page is the smallest unit of the memory device that may be programmed or written to.

Programming of a page is accomplished by a corresponding page of sense amplifiers (SA) 212, wherein each sense amplifier may be coupled to a respective NAND string 50 via a bit line (BL) (see e.g., the bit lines BL0, BL1, BL2, BLm-1, and BLm, as depicted in FIG. 5). Thus, a page 60 is enabled by the control gates of the plurality of memory cells 10 in page 60, which are connected to a common word line (WL) 42, and each memory cell 10 of the page 60 is accessible by a sense amplifier via a bit line 36. Accordingly, when programming or sensing a page 60 of memory cells 10, a programming or sensing voltage is respectively applied to the common word line (e.g., word line WL3 with respect to page 60) together with the appropriate voltages on the bit lines.

Regarding the manner in which data is programmed and erased, it is important to note that, with respect to flash memory, a memory cell must be programmed from an erased state. In other words, a floating gate 20 must first be emptied of charge, thereby placing the memory cell in an erased state, before a programming operation can subsequently add a desired amount of charge back to the floating gate 20. Thus, the level of charge on a floating gate 20 cannot be incrementally increased or decreased from its previous programmed level. Therefore, it is not possible for update data to overwrite the existing data of a memory cell 10. Rather, the update data must be programmed to a previous unwritten location.

For purposes of promoting performance in erase operations, an array 210 of memory cells 10 is, for example, divided into a large number of blocks of memory cells, wherein a block is the smallest unit of the memory device in which the memory cells contained may be erased together. Furthermore, each block of memory cells 10 may be divided into a number of physical pages 60 wherein, as mentioned above, a programming operation is conducted page by page. Accordingly, a logical page is a unit of programming or reading that contains a number of bits equal to the number of memory cells 10 in a given physical page.

To illustrate an exemplary embodiment of the programming stages of, for example, a MLC memory device that is comprised of a population of four-state memory cells, reference is made to FIGS. 6A-C.

To illustrate an exemplary embodiment of the programming stages of, for example, a MLC memory device that is comprised of a population of four-state memory cells, reference is made to FIGS. 6A-C. In FIG. 6A, there is depicted a population of memory cells in which the characteristic threshold voltage ($V_{th}$) window is divided into four distinct voltage distributions, with each distribution corresponding to a programmable memory state (i.e., memory states "0," "1," "2," and "3"). FIG. 6B illustrates an initial distribution of "erased" threshold voltages ($V_{th}$) for an erased memory. In FIG. 6C, much of the memory cell population has been programmed such that the initial "erased" threshold voltage of a given memory cell 10 is moved to a higher value into one of the three divided voltage zones that are demarcated by verify levels $vV_1$, $vV_2$, and $vV_3$. Accordingly, each memory cell can be programmed to one of the three programmable states "1," "2," and "3," or remain in the "erased" state. On a bit level, a two-bit code having, for example, a lower bit and upper bit can be used to represent each of the four memory states. For example, as depicted in FIG. 6C, the memory states "0," "1," "2," and "3" may be assigned bit values "11," "01," "00," and "10" respectively. In such example, the two-bit data may be read from the memory by sensing in a "full-sequence" mode in which the two bits are, for example, sensed together by sensing relative to the corresponding read demarcation threshold voltages—$rV_1$, $rV_2$, and $rV_3$—in three sub-passes respectively.

In FIGS. 4A-B and 5 and the foregoing corresponding description, there is generally described a two-dimensional (or planar) memory array 210 (lying in a x-y plane, for example), which may comprise NAND-type memory cells. However, in an alternative configuration, a memory array may be in the form of a three-dimensional array that, unlike being formed on a planar surface of a semiconductor wafer, the array extends upwards from the wafer surface and comprises stacks or columns of memory cells extending vertically in an upwards direction (for example, in a z direction that is perpendicular to the x-y plane). As a result, three-dimensional memory structures increase the storage density but consume less chip surface. For example, in FIG. 7 there is depicted an exemplary embodiment of a 3D NAND-type string 701, which is operated in a similar manner as a two-dimensional NAND-type string, such as the NAND-type string 50 described above. In this configuration, a memory cell is formed at the juncture of a vertical bit line (BL) (see e.g., the local bit line 703) and a word line (see e.g., word lines WL0, WL1, etc.), wherein a charge trapping layer located between the local bit line 703 and an intersecting word line (WL) stores charge. In order to form such a vertical string 701, stacks of word lines are formed and memory holes are etched at the appropriate locations where the cells are to be formed, wherein each memory hole is lined with a charge trapping layer and filled with a suitable local bit line/channel material. Additionally, dielectric layers are included for the necessary isolation. Further, located at either end of the NAND-type string 701 are select gates 705, 707, which allow for the selective connection to, or isolation from, external elements 709, 711 that include, for example, conductive lines (such as common source lines or bit lines) that serve large numbers of strings 701 of a memory array. In the particular embodiment shown in FIG. 7, the vertical NAND-type string 701 has 32 memory cells (i.e., at the juncture between the local bit line 703 and word lines 0 through 31) that are connected in series. However, a NAND-type string 701 may comprise any suitable number of memory cells.

Referring back to the overall architecture of a memory system that is, for example, depicted in FIG. 1, there is shown a schematic depiction of a typical arrangement of an example memory device 102. In this particular embodiment, the memory device 102 comprises one or more memory die 104 wherein each memory die 104 may include a two- or three-dimensional memory structure 200, such as the two- and three-dimensional memory arrays described above with respect to FIGS. 4A-B, 5 and 6, as well as the associated control circuitry 115 and read/write/erase circuits 170. For example, memory structure 200 may comprise a monolithic three-dimensional memory structure in which multiple memory levels are formed above (rather than in) a single substrate, such as a wafer, without any intervening substrates. Further, the memory structure 200 may be comprised of any type of non-volatile memory monolithically formed in one or more physical levels of arrays of memory cells having an active area that is disposed above a silicon substrate. Such a memory structure may be in a non-volatile memory device in which the circuitry that is associated with the operation of the memory cells may be above or within the substrate.

Still referring to FIG. 1, the memory structure 200 is accessible by the read/write/erase circuits 170 by way of a row decoder 130 and a column decoder 132. As previously described, individual memory cells of the memory structure 200 are addressable via a set of selected word lines (WL) and bit lines (BL). Specifically, the row decoder 130 selects the one or more word lines and the column decoder 132 selects one or more bit lines in order to apply the appropriate voltages to the respective gates of the addressed memory cells. As shown in FIG. 1, the read/write/erase circuits 170 comprise multiple sense blocks 180 (Sense Block 1, Sense Block 2, . . . , Sense Block p) that are connectable via bit lines to the memory elements of the memory structure 200. The sense blocks 180 allow memory cells connected to a common word line (referred to as a "page" of memory cells) to be read or programmed in parallel. In some embodiments, a controller 100 is included in the same memory device 102 as the one or more memory die 104 or, in other embodiments, the controller 100 may be located separate from the memory die 104. In some embodiments, the controller 100 may be on an entirely different die from the memory die 104. Further, in certain embodiments, each memory die 104 may have its own controller 100 or, in other embodiments, one controller 100 may communicate amongst multiple memory die 104. According to the exemplary embodiment of FIG. 1, commands and data are transferred between the host 80 and the controller 100 by way of a data bus 140, and between the controller 100 and the one or more memory die 104 via lines 150. According to certain embodiments, the memory die 104 include input and/or output (I/O) pins that connect to the lines 150.

According to certain exemplary embodiments, the controller 100 manages data that is stored in the memory device 102 and communicated with the host 80. The controller 100 may have various functionalities that include, for example, formatting the memory to ensure it is operating properly, map out bad memory components, and allocate spare memory cells to be substituted for future failed cells. In operation, when a host 80 needs to read data from or write data to the memory, it will communicate with the controller 100. If the host provides a logical address to which data is to be read/written, the controller 100 can convert the logical address received from the host to a physical address in the memory. Alternatively, the host can provide the physical address. In further embodiments, the controller 100 can perform various memory management functions such as, but not limited to, wear leveling (distributing writes in order to avoid repeatedly writing, and thereby wearing out, specific blocks of memory) and garbage collection in which, for example, valid pages of data are culled (or moved) from a full memory block in order for the entire block to be erased and reused.

The components of the controller 100 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. In some exemplary embodiments, each module may comprise an application-specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include software stored in a processor readable device (e.g., memory) to program a processor for controller 100 to perform the desired functions.

Additionally, the control circuitry 115 cooperates with the read/write/erase circuits 170 in performing memory operations (e.g., read, program, erase, etc.) with respect to memory structure 200, and includes, for example, a state machine 112, an on-chip address decoder 114, and a power control module 116. The state machine 112 provides die-level control of memory operations that include, for example, programming certain memory cells to different final target states. Further, the on-chip address decoder 114 provides an address interface between the addresses used by host 80 or controller 100 to the hardware address used by row and column decoders 130, 132. The power control module 116 controls the power and voltages that are supplied to the word lines and bit lines during memory operations. As such, the power control module 116 may comprise drivers for word line layers (with respect to a 3D memory configuration), select transistors, and source lines. Also, the power control module 116 may include charge pumps for generating voltages. The sense blocks 180 include the bit line drivers. Any one or any combination of control circuitry 115, state machine 112, decoders 114/130/132, power control module 116, sense blocks 180, read/write/erase circuits 170, and/or controller 100 can be considered a control circuit that performs the functions described herein.

As described above, memory cells of the memory structure 200 may be arranged in a single memory device level in an ordered two-dimensional array of a plurality of rows and/or columns. Alternatively, a three-dimensional memory array may be arranged such that memory cells occupy multiple planes or multiple memory device levels, thereby forming a structure that has three dimensions (e.g., in the x, y, and z directions, wherein the z direction is substantially perpendicular and the x and y directions are substantially parallel to the major surface of the semiconductor substrate). In some exemplary embodiments, a three-dimensional memory structure 200 may be vertically arranged as a stack of multiple two-dimensional memory array device levels. In other exemplary embodiments, the three-dimensional memory structure 200 is arranged as multiple vertical columns (wherein each column extends substantially perpendicular to the major surface of the substrate, i.e., in the z direction) with each column having multiple memory cells. In this example, the vertical columns may be arranged in a two-dimensional configuration (i.e., in the x-y plane), thereby forming a three-dimensional arrangement in which the memory cells are on multiple vertically stacked memory planes. Other configurations of memory elements in three dimensions can also constitute a three-dimensional memory array. However, generally speaking, a three-dimensional NAND array may be constructed by tilting a two-dimensional memory structure, such as structures 50 and 210 of FIGS. 4A-B and 5, respectively, in the vertical direction that is perpendicular to the x-y plane (i.e., the z direction), such that each y-z plane of the three-dimensional structure corresponds to the page structure of FIG. 5, wherein each plane is at differing locations along the x axis. As a result, the global bit lines (e.g., BL0, . . . , BLm, of FIG. 5) each run across the top of the memory structure to an associated sense amplifier (e.g., SA0, . . . , SAm). Accordingly, the word lines (e.g., WL0, . . . , WLn, of FIG. 5), and the source and select lines (e.g., SSL0, . . . , SSLn, and DSL0, . . . , DSLn, respectively) extend in the x direction, with the bottom of each NAND string (e.g., string 50) connected to a common source line.

Referring now to FIG. 8, there is depicted an oblique perspective view of an example subsection of an embodiment of a three-dimensional NAND memory array 600 of the Bit Cost Scalable ("BiCS") type in which one or more memory device levels is formed above a single substrate.

The example subsection corresponds to two of the page structures shown in FIG. 4B wherein, depending upon the particular embodiment, each may correspond to a separate memory block or may be different extensions of the same block. According to this embodiment, rather than lying in the same y-z plane, the NAND strings are pressed in the y-direction such that the NAND strings have a staggered configuration in the x-direction. Further, at the top of the array 600, the NAND strings are connected along global bit lines (BL) that span multiple of these subsections of the array 600 that run in the x-direction. In addition, global common source lines (SL) also run across multiple subsections of the memory array 600 in the x-direction and are connected to the sources at the bottom of the NAND strings by a local interconnect (LI) that operates as the local common source line of the individual extension. However, dependent upon the embodiment, the global source lines (SL) can span the whole, or just a subsection, of the memory array 600. Depicted on the right side of FIG. 8 is a schematic representation of the fundamental elements of one of the vertical NAND strings 610 of the memory array 600. Similar to the NAND string 50 of FIG. 4A, the string 610 is comprised of a series of interconnected memory cells. The string 610 is connected to an associated bit line (BL) through a drain select gate (SGD). A source select gate (SGS) connects the string 610 to a global source line (SL) through an associated local source line (LI). Further included in this particular embodiment are several dummy cells located at the ends of the string 610. Due to their proximity to select gates (SGD, SGS) and, thereby, their susceptibility to disturbs, the dummy cells are not used to store user data.

Turning to FIG. 9, there is shown a top view of two representative blocks (i.e., BLK0 and BLK1) of the array structure 600 of FIG. 8. According to this particular embodiment, each block is comprised of four extensions that extend from left to right. Further, the word lines and the select gate lines of each level also extend from left to right, wherein the word lines of the different extensions of the same block are commonly connected at a "terrace" from which they receive their various voltage levels by way of word line select gates (WLTr). It should also be noted that the word lines of a given layer of a block may be commonly connected on the far side from the terrace. Also, the selected gate lines can be individual, rather than common, for each level, thereby allowing for each extension to be individually selected. In addition, the bit lines (BLs) run vertically as depicted, and connect to the sense amplifier circuits (SAs) where, depending on the embodiment, each sense amplifier can correspond to a single bit line or be multiplexed to several bit lines.

The side view that is provided in FIG. 10 shows the four extensions of an individual block 650 of the array structure 600 of FIG. 8 in greater detail. According to this particular embodiment, select gates (SGD, SGS) at either end of the NAND strings are formed with four layers, with the word lines (WLs) therebetween, all formed over a CPWELL. Accordingly, in order to select a given extension, the voltage level (VSG) of the select gates is set and the word lines (WLs) are biased according to the operation, either at a read voltage (VCGRV) for the selected word lines (WLs), or at a read-pass voltage (VREAD) for the non-selected word lines (WLs). The non-selected extensions may then be cut off by setting their select gates accordingly.

Figure 11A:
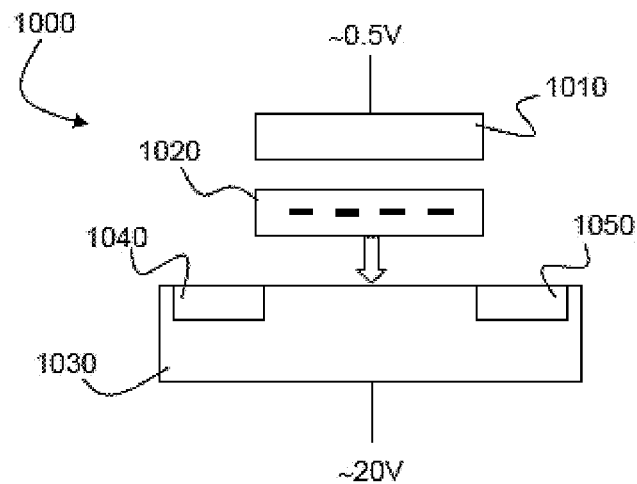
FIG. 11A is a diagrammatic illustration of a memory erase operation with respect to a programmable transistor of a two-dimensional memory structure, in accordance with exemplary embodiments.
Figure 11B:
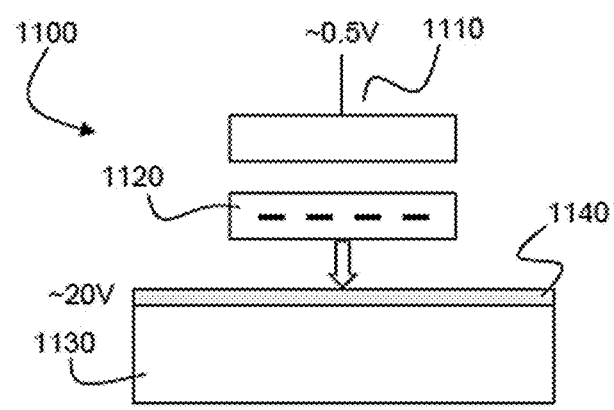
FIG. 11B is a diagrammatic illustration of a memory erase operation with respect to a programmable transistor of a three-dimensional memory structure, in accordance with exemplary embodiments.

Returning now to the programming and erase memory operations with respect to non-volatile memory, these two operations may be generally described in the following manner. As described above, each cell comprises a floating gate MOS transistor, wherein the floating gate (FG) is an electrically isolated conductor. Accordingly, when programming a memory cell, a relatively high voltage is applied to the control gate of the memory cell (in the case of a two-dimensional array) or the appropriate word line (WL) (in the case of a three-dimensional array) and, as a result, electrons are injected into the floating gate by means of, for example, Fowler-Nordheim (F-N) Tunneling. Data bits are then stored by trapping charge on the floating gate, wherein the logic value is defined by its threshold voltage and the amount of electrical charge stored. Conversely, to erase a memory cell, electrons in the floating gate are removed by, for example, a process referred to as quantum tunneling, to the source and/or the semiconductor substrate. More specifically, in some exemplary embodiments, electrons are removed from the charge trapping layer (i.e., floating gate) by applying a low voltage to the control gate and increasing the channel voltage to a high voltage, thereby creating an electric field that causes electrons to be pushed back into the semiconductor substrate. This process is diagrammatically illustrated in FIG. 11A, which generally depicts a two-dimensional NAND-type memory cell configuration 1000 comprising a control gate 1010, a floating gate 1020, and the underlying semiconductor substrate 1030 (e.g., polysilicon) comprising the memory cell's source and drain terminals (see 1040 and 1050, respectively). According to this particular embodiment, a relatively low voltage (0.5 V, for example) is applied to the control gate 1010 and a relatively high voltage VERA (20 V, for example) is applied to substrate body 1030, causing the electron charges (−) trapped at the floating gate 1020 to be pushed back into substrate 1030. Similarly, depicted in FIG. 11B is a diagrammatic view of a general erase process with respect to a three-dimensional NAND-type memory cell configuration 1100, according to an exemplary embodiment. Here, a relatively low voltage (e.g., ∼0.5 V) is applied to the appropriate word line 1110 and a relatively high voltage VERA (e.g., ∼20 V) is applied to a channel 1140 of the memory structure 1130, the channel being comprised of holes. As a result, the electron charges (−) are pushed out of the charge trapping layer 1120.

Figure 12:
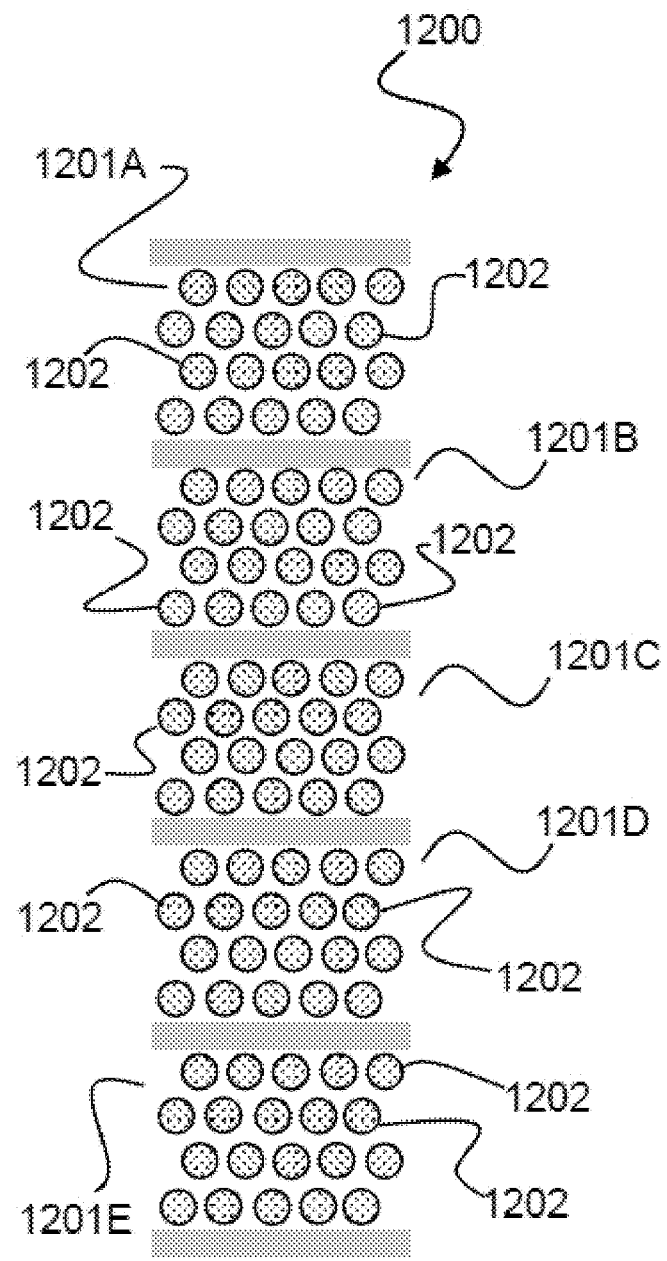
FIG. 12 is a top view of a vertical NAND-type string of a three-dimensional memory array, wherein the string exhibits location-dependent inconsistencies in electrical characteristics and/or behaviors as a result of variations in the cell structures amongst its memory storage elements, in accordance with exemplary embodiments.

As mentioned above, these high storage density memory structures, such as the BiCS type described, for example, with respect to the embodiment depicted in FIGS. 8-10, have relatively small spacing between adjacent memory cells and each cell has a relatively small tolerance between discrete voltage ranges for memory functions. Accordingly, improving the amount of efficient storage capability within a fixed die size has competing drawbacks and liabilities. As previously mentioned, some challenges arise from the unintended structural variations occurring in the semiconductor materials comprising the memory structure as an intrinsic result of existing fabrication processes. For example, it is possible that, in a scalable memory structure, variations in the electrical characteristics and behaviors may occur between locations or substructures of the memory device (e.g., between memory cells, strings, or blocks located in proximity to one another) may be encountered as an inherent development of the fabrication process of the memory. To illustrate one such phenomenon in a general manner, depicted in FIG. 12 is a non-limiting example of a memory structure 1200. In this particular example, memory structure 1200 is a NAND-type three-dimensional memory array, wherein structure 1200 comprises five vertical memory strings (such as string 701 shown in FIG. 7), designated 1201A-1201E. As depicted, in this specific implementation, stacked memory holes (cells) 1202 of each of the memory strings 1201A-1201E are arranged in an offset or staggered pattern to form, for example, a 20-memory hole or cell configuration. Under certain circumstances, the memory holes 1202 of the respective strings 1201A-1201E of this type of structure 1200 may exhibit, when examined, variations in electrical characteristics and/or behaviors. For example, the optimal time period (referenced herein as the "delta" or "DSEN1" time period) occurring between consecutive sense signals applied during a program verify operation with respect to such a memory structure may become skewed from the outer to the interior memory strings such that application of a uniform delta time period (DSEN1), to the entirety of the memory structure is distinctly problematic. At focus in the following description are mitigation or corrective mechanisms that consider the apparent interrelationship or interdependence between the relative location(s) of the storage elements of a memory structure and correlative variations in the electrical characteristics and/or behaviors. More specifically, exemplary embodiments of a program verify operation scheme and methodology are described below and involve the application of an offset parameter time value to the optimal time period occurring between consecutive sense signals. The application and/or magnitude of the offset parameter time value may be based upon, or determined by, for example, the relative physical locations (e.g., an innermost string versus an outermost string) within the memory structure to which the program verify operation is being performed.

Figure 13:
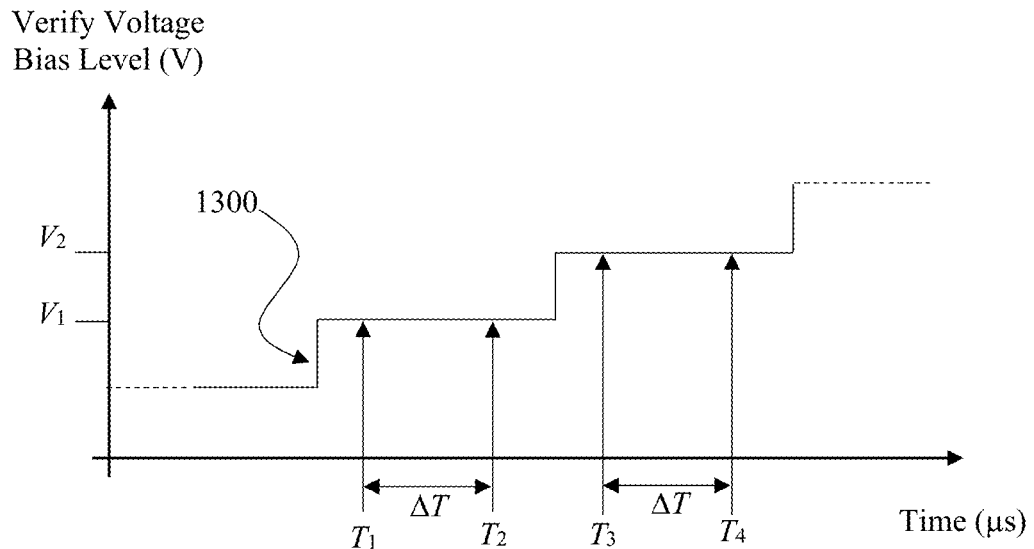
FIG. 13 depicts an aspect of a program verify operation scheme relative to the time domain, in accordance with exemplary embodiments.

By way of background, FIG. 13 provides a general illustration of a program verify operation scheme according to an exemplary embodiment. As depicted, a plot line 1300 indicates a word line (WL) voltage bias level as applied relative to the time domain during the program verify operation. At each word line (WL) voltage bias level applied, the resulting current flow (and, by extension, the threshold voltage ($V_{th}$)) is sensed at a preset and specific point in time. In the particular example shown in FIG. 13, a first word line (WL) voltage bias level $V_1$, an initial sense signal is applied at a first time $T_2$ according to the program verify operation scheme. However, in order to sense the resulting current flow more precisely and, thereby, beneficially tighten the threshold voltage ($V_{th}$) margin, two (or more) sense signals that are separated by an interval of time may be applied at each word line (WL) voltage bias level that is being sensed. Therefore, as shown in FIG. 13, a first sense signal may be applied at a point in time, $T_1$, that is, for example, prior to the sense signal applied at time $T_2$. As such, the two sense signals are separated by a preset optimal time period, i.e., $\Delta T$ (may be referred to as a "delta" time or "DSEN1"). Continuing onward to a higher programmable state, during the program verify operation scheme, a second word line (WL) voltage bias level $V_2$ is applied. Again, two sense signals may be consecutively applied at first and second points in time (i.e., times $T_3$ and $T_4$, respectively) that are separated by the optimal time period, $\Delta T$. Further, this dual sense time approach may be applied at each programmable state during the entirety of the program verify operation.

Figure 14A:
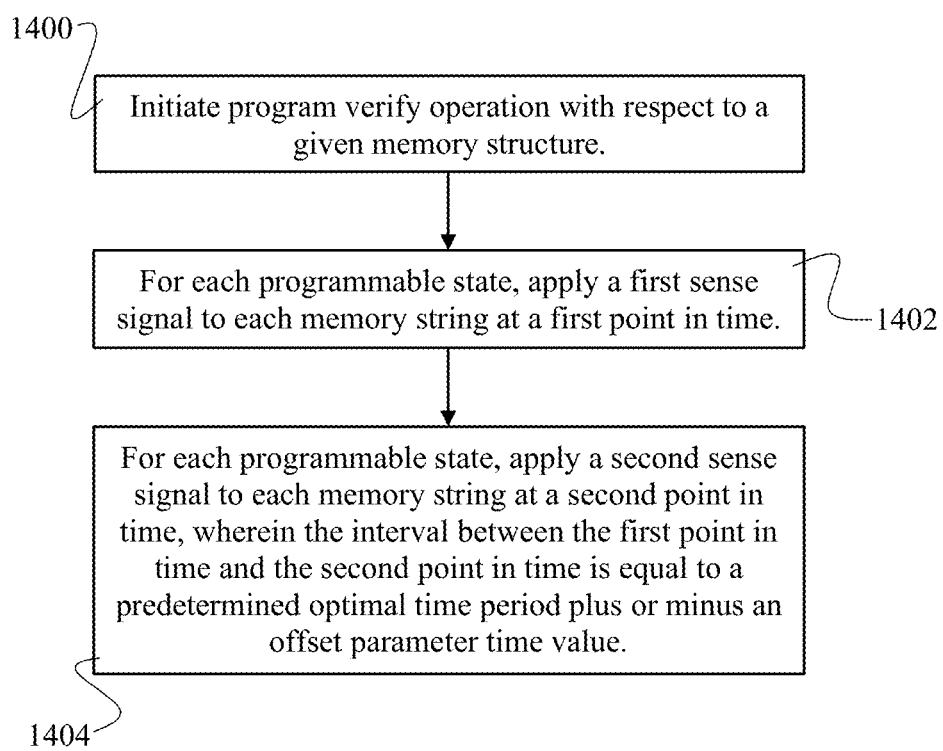
FIG. 14A is a flow diagram generally illustrating steps of a program verify operation of a target memory cell with an adjusted optimal sense time parameter, according to an exemplary embodiment.

As mentioned above, the optimal time period or interval separating consecutive sense signals according to the above program verify operation scheme may become skewed from a predetermined parameter value when uniformly applied to a given memory structure due to the variations in electrical characteristics and/or behaviors exhibited across the memory structure, which are particularly evident when comparing between the inner and outer memory strings. Accordingly, offset time values to the optimal time period parameter occurring between consecutive sense signals may be built into the verify voltage biasing scheme in order to accommodate the effects of cell structural variations in a given memory structure, wherein the offset time values may be predetermined and can be derived using a comparative technical data analysis of the memory operation performance (e.g., an analysis of an optimal time period occurring between consecutive sense signals) at various locations within the memory structure. While the exact offset time values employed may differ amongst differing memory structures, configurations, and/or implementations, the flow diagram in FIG. 14A illustrates a general framework of a program verify voltage biasing scheme according to an exemplary embodiment thereof. This basic framework takes into account the technical and experimental observations, data, analysis, and evaluations that may be made with respect to location-dependent variations of the optimal time period occurring between consecutive sense signals and the threshold voltage ($V_{th}$) margin(s) exhibited.

Beginning at step 1400 in FIG. 14A, a program verify operation is first initiated with respect to a given memory structure. Continuing on to step 1402, a first sense signal is applied to the memory structure at a first point in time according to the program verify scheme being implemented. Next, at step 1404, a second sense signal is applied to the memory structure at a second point in time, wherein the interval of time between the first point in time and the second point in time is equal to a predetermined optimal time period plus or minus an offset parameter time value. The predetermined optimal time period may be initially set according to a target or default time period or interval that is typical or is expected for the given memory structure assuming that the entire memory structure exhibits uniform process conditions throughout. Further, steps 1402 and 1404 may be performed for each programmable state.

It should be noted that although the general methodology set forth in FIG. 14A entails applying a single offset parameter time value to the program verify scheme with respect to the entire memory structure, this uniform application is just one non-limiting example of the offset sense time value approach described herein. For example, as depicted in the exemplary embodiments that are outlined in FIGS. 14B and 14C, the application of a parameter time value offset to a given memory structure may be nonuniform or selective in one or more ways that are location-determinative. In the particular example demonstrated in FIG. 14B, a program verify operation is initiated with respect to a vertically-stacked memory structure (e.g., the memory structure depicted in FIG. 12) (see step 1410). Thereafter, at step 1412, a first sense signal is applied to the memory structure at a first point in time according to the program verify scheme being implemented. However, in contrast to the exemplary embodiment described above with respect to FIG. 14A, a different approach is performed with respect to the second sense signal. Specifically, at step 1414, an offset parameter time value is not applied to the intervening time period between the first and second sense signals with respect to the outermost memory strings (i.e., the topmost and bottommost memory strings of the memory structure). Rather, a predetermined optimal time period is simply applied. However, with respect to the remaining (inner) memory string(s) of the memory structure, a second sense signal is applied at a second point in time that is equal to a predetermined optimal time period plus or minus a preset offset parameter time value (see step 1216).

Figure 14B:
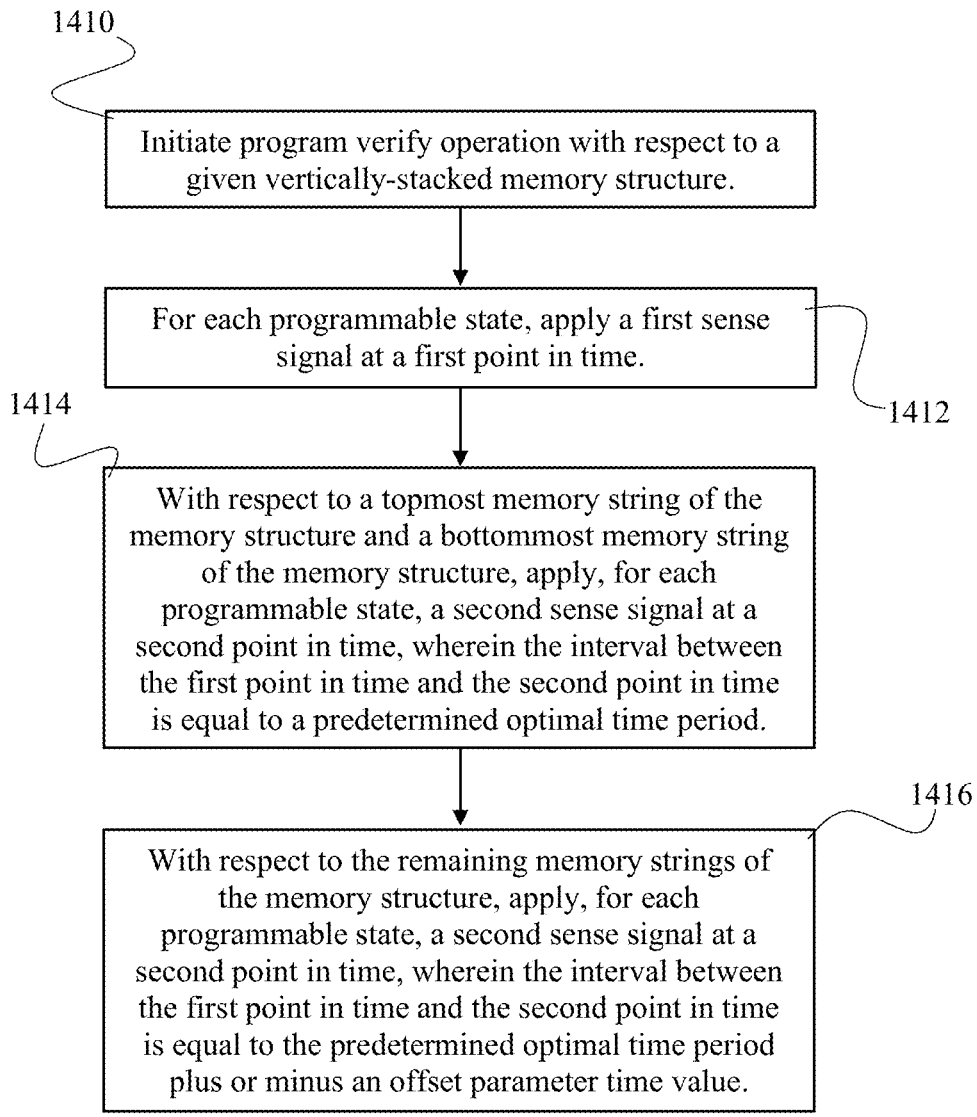
FIG. 14B is a flow diagram generally illustrating steps of a program verify operation of a target memory cell with an adjusted optimal sense time parameter that is dependent upon a location of the target memory cell within an exemplary three-dimensional memory structure, according to an exemplary embodiment.
Figure 14C:
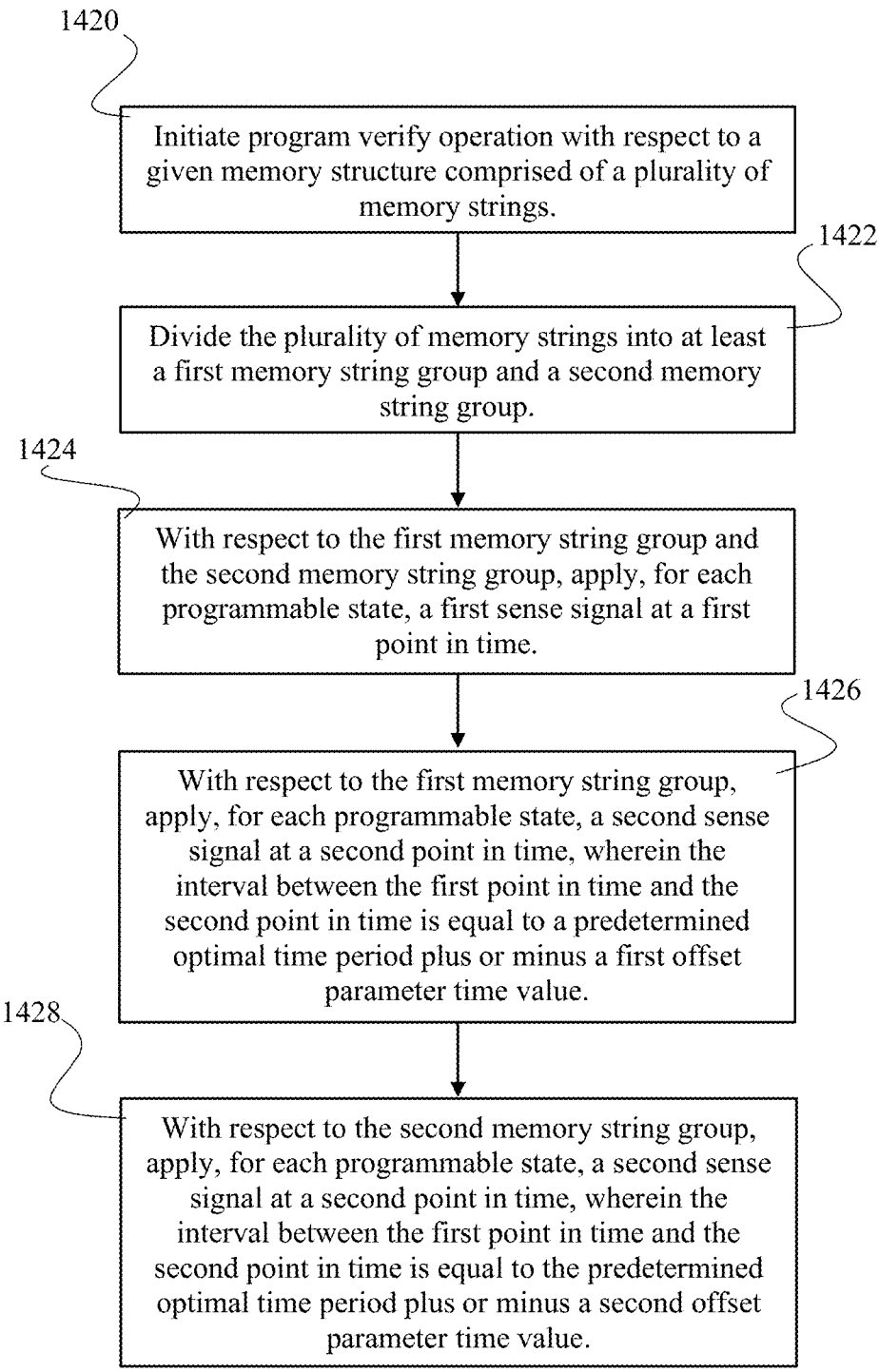
FIG. 14C is a flow diagram generally illustrating steps of a program verify operation of a target memory cell with an adjusted optimal sense time parameter that is dependent upon a location of the target memory cell within an exemplary three-dimensional memory structure, according to another exemplary embodiment.

Further, in the exemplary embodiment shown in FIG. 14C, application of an offset parameter time value may differ with respect to location, magnitude, or both. According to this particular embodiment, after a program verify operation is first initiated (see step 1420), the plurality of memory strings that comprise the memory structure are divided into two or more memory string groups (or other sub-populations) (see step 1422). Thereafter, a first sense signal is applied to all memory strings at a first point in time (see step 1424). However, in applying a second sense signal to a first memory string group at a second point in time, the time interval between the first point in time and the second point in time is equal to a predetermined optimal time period plus or minus a first offset parameter time value (see step 1426). Further, when applying a second sense signal to a second memory string group at a second point in time, the interval of time between the first point in time and the second point in time is equal to the predetermined optimal time period plus or minus a second offset parameter time value (see step 1428), wherein the first offset parameter time value is different in magnitude from the second offset parameter time value. The magnitude of the first offset parameter time value may be proportional to, or a mathematical factor of, the magnitude of the second offset parameter time value. In another example, the first offset parameter value may differ from the predetermined optimal time period by a predetermined increment, and the magnitude of the second offset parameter time value may differ from the first offset parameter time value by the identical increment.

The exemplary embodiments shown in FIGS. 14A-14C are intended to show that an offset parameter time value may be uniformly or nonuniformly applied. The interval time adjustments may be correlated to memory (e.g., memory string or cell) location, whereby the fundamental objective is to normalize and stabilize the threshold voltage ($V_{th}$) margins and, thereby, overall memory operation performance.

The above discussion is meant to be illustrative of the principles and various embodiments of the present invention. Numerous variations and modifications will become apparent to those skilled in the art once the above disclosure is fully appreciated, and may be employed without departing from the scope of the disclosure, limited only by any practical limitations related to the materials and the physical principles of the devices that are described. Accordingly, it is intended that the following claims be interpreted to embrace and encompass all such variations and modifications.

What is claimed is:

1. A method for performing a program verify memory in a non-volatile memory system, comprising the steps of:
preparing a memory structure that includes:
an array of memory cells that are arranged in a plurality of NAND strings and in a plurality of word lines,
the NAND stings including memory holes and extending between respective bit lines and a common source line,
each of the memory cells including a control gate and a charge storing element,
the plurality of NAND strings including outer strings that are physically arranged on opposite sides of inner NAND strings;
determining a location of the target memory cell within the memory structure;
in response to the target memory cell being located in one of the outer NAND strings, setting an offset parameter time value at a first magnitude, and in response to the target memory cell being located in one of the inner NAND strings, setting the offset parameter time value at a second magnitude that is different than the first magnitude; and
respect to each programmable memory state:
applying a first sense signal at a first point in time; and
applying a second sense signal at a second point in time, wherein a time interval between the first and second points in time is equal to a predetermined optimal time period that is adjusted by the offset parameter time value.

2. The method according to claim 1, wherein the memory structure is a vertical three-dimensional NAND-type array.

3. The method according to claim 2, wherein the plurality of NAND strings exhibit variations in their respective cell structures.

4. The method according to claim 2, wherein:
the first magnitude is equal to zero.

5. The method according to claim 1, wherein the first magnitude is mathematically proportional to the second magnitude.

6. A memory controller, comprising:
a first port configured to couple to a non-volatile memory structure, the memory structure comprising at least one vertical three-dimensional NAND-type memory array of memory cells;
the memory cells being arranged in a plurality of NAND strings and in a plurality of word lines;
the NAND strings including memory holes that extend between respective bit lines and a common source line;
each of the memory cells including a control gate and a charge storing element;
the plurality of NAND strings including outer strings that are physically arranged on opposite sides of inner NAND strings;
and
during program verify of a target memory cell, the memory controller being configured to:
initiate a program verify operation with respect to the target memory cell;
determine a location of the target memory cell within the memory array;
in response to the target memory cell being located in one of the outer NAND strings, set an offset parameter time value at a first magnitude, and in response to the target memory cell being located in one of the inner NAND strings, set the offset parameter time value at a second magnitude that is different than the first magnitude; and
with respect to each programmable memory state:
apply a first sense signal at a first point in time; and
apply a second sense signal at a second point in time, wherein a time interval between the first and the second points in time is equal to a predetermined optimal time period that is adjusted by the offset parameter time value.

7. The memory controller according to claim 6, wherein the plurality of NAND strings exhibit variations in their respective cell structures.

8. The memory controller according to claim 6, wherein:
the first magnitude is set equal to zero.

9. The memory controller according to claim 6, wherein the first magnitude is mathematically proportional to the second magnitude.

10. A non-volatile memory system, comprising:
a memory structure that comprises at least one vertical three-dimensional NAND-type memory array having a target memory cell, the memory structure including;

an array of memory cells that are arranged in a plurality of NAND strings and in a plurality of word lines,
the NAND stings including memory holes that extend between respective bit lines and a common source line,
each of the memory cells including a control gate and a charge storing element,
the plurality of NAND strings including outer strings that are physically arranged on opposite sides of inner NAND strings;
a memory controller coupled to the memory structure, the memory controller being configured to:
initiate a program verify operation with respect to the target memory cell;
determine a location of the target memory cell within the memory array;
in response to the target memory cell being located in one of the outer NAND strings, set an offset parameter time value at a first magnitude, and in response to the target memory cell being located in one of the inner NAND strings, set the offset parameter time value at a second magnitude that is different than the first magnitude; and
with respect to each programmable memory state:
apply a first sense signal at a first point in time; and
apply a second sense signal at a second point in time, wherein a time interval between the first and the second points in time is equal to a predetermined optimal time period that is adjusted by the offset parameter time value.

11. The non-volatile memory system according to claim 10, wherein the plurality of memory strings exhibit variations in their respective cell structures.

12. The non-volatile memory system according to claim 10, wherein:
the second magnitude is equal to zero.

* * * * *